(12) United States Patent
Wei et al.

(10) Patent No.: US 6,242,357 B1
(45) Date of Patent: Jun. 5, 2001

(54) METHOD FOR FORMING A DEEP TRENCH CAPACITOR OF A DRAM CELL

(75) Inventors: Houng-Chi Wei, I-Lan; Wei-Shang King, Taipei, both of (TW)

(73) Assignee: Mosel Vitelic Inc., Hsinchu (TW)

( * ) Notice: Subject to any disclaimer, the term of this patent is extended or adjusted under 35 U.S.C. 154(b) by 0 days.

(21) Appl. No.: 09/306,378

(22) Filed: May 6, 1999

(51) Int. Cl.[7] .................................................. H01L 21/311

(52) U.S. Cl. .......................... 438/700; 706/745; 706/753

(58) Field of Search ................................... 438/700, 706, 438/745, 753

(56) References Cited

U.S. PATENT DOCUMENTS

| 4,975,383 | * | 12/1990 | Baglee | 438/258 |
| 5,545,583 | * | 8/1996 | Lam et al. | 438/386 |
| 5,719,080 | * | 2/1998 | Kenney | 438/243 |
| 5,869,367 | * | 2/1999 | Fazan et al. | 438/253 |
| 5,913,118 | * | 6/1999 | Wu | 438/243 |

OTHER PUBLICATIONS

Asahina et al., Etching polysilicon without generating undercut—using chlorine and hydrogen bromide aa processing gases in e.g. microwave plasma etching. English abstract of JP 05243188A, Sep. 1993.*

* cited by examiner

Primary Examiner—Benjamin L. Utech
Assistant Examiner—Lynette T. Umez-Eronini
(74) Attorney, Agent, or Firm—Nath & Associates PLLC; Harold L. Novick

(57) ABSTRACT

A method of forming a DRAM cell with a trench capacitor over a semiconductor substrate comprises the following steps. First, an etching step is performed to form a trench structure in the substrate, wherein the trench structure has a bottom and sidewalls, and the sidewalls are adjacent to the bottom. Then, the trench structure is doped to form a doping region on the bottom and a portion of the sidewalls. A selective etching step is performed to remove a portion of the doping region, wherein a selectivity of the doping region is higher than that of undoped sidewalls. A dielectric layer is formed on a top surface of the trench structure. A conducting layer is then formed in the trench structure. Next, a gate structure is formed on the substrate. A doping step is used to form the drain/source structures adjacent to the gate. A strap region is formed to couple the conducting layer and the drain/source structures.

18 Claims, 5 Drawing Sheets

METHOD FOR FORMING A DEEP TRENCH CAPACITOR OF A DRAM CELL

FIELD OF THE INVENTION

The present invention relates to a process for manufacturing a semiconductor device, and more specifically, to a process for manufacturing a deep trench for a Dynamic Random Access Memory (DRAM) cell.

BACKGROUND OF THE INVENTION

With the advance of the integrated circuits technology, the DRAM devices are widely applied in integrated circuits. In generally, A DRAM device comprises many memory cells, and each memory cell typically consists of a storage capacitor and an access transistor for storing each bit by the semiconductor DRAM. Either the source or drain of the transistor is connected to one terminal of the capacitor. The other side of the transistor and the transistor gate are connected to external connection lines such as bit lines and word lines, respectively. The other terminal of the capacitor is connected to a reference voltage. Thus, the formation of a DRAM memory cell comprises the formation of a transistor, a capacitor and contacts to external circuits. The digital data is stored in the capacitors and accessed by the MOSFETs, bit lines, and word lines arrays by connecting electrically the capacitors and the sources of the transistors.

However, with the coming of Ultra Large Scale Integrated (ULSI) DRAM devices, the sizes of memory cells have gotten smaller and smaller such that the area available for a single memory cell has become very small. This causes reduction in capacitor area, resulting in the reduction of cell capacitance. Accordingly, for the memory cells in DRAM devices, the most important issue currently is how to promote the storage ability and operation stability of capacitors when the scales of devices still decreases and the integration increases. Thus, the susceptibility of capacitors due to a particle radiation and soft errors is lowered, and the increasing refresh frequency is improved.

For solving the issues above, the prior art approaches to overcome these problems have resulted in the development of the various types of capacitors, such as the trench capacitor and the stacked capacitor. However, The manufacture of the stacked capacitor causes difficulties due to the limitation of the lithography technique. Besides, enormous stacked structures for promoting storage capacity usually cause the crack of the stacked structure occurring due to the unequally stress. On the other hand, the storing capacity of trench capacitor can not be promoted effectively due to the scale of trench capacitor is restricted. In additional, the punch through leakage is also an important issue for manufacturing the trench capacitors with the scale of trench capacitor smaller than micrometer.

SUMMARY OF THE INVENTION

The prime objective of the present invention is to provide a method for manufacturing a deep trench capacitor for a DRAM cell.

The second objective of the present invention is to provide a method for enlarge the surface of the deep trench capacitor of the DRAM cell.

The further objective of the present invention is to enlarge the surface of a capacitor by using a selective etching method.

A method of forming a DRAM cell with a trench capacitor over a semiconductor substrate comprises the following steps. First, an etching step is performed to form a trench structure in the substrate, wherein the trench structure has a bottom and sidewalls adjacent to the bottom. Then, the trench structure is doped to form a doping region on the bottom and a portion of the sidewalls. A selective etching step is performed to remove a portion of the doping region, wherein a selectivity of the doping region is higher than that of undoped sidewalls, and the residual doping region is used to serve as the first storage electrode. Next, a dielectric layer is formed on a top surface of the trench structure. A conducting layer is then formed in the trench structure to be the second storage electrode. A collar oxide layer is formed on the outer surface of the undoped sidewalls. Next, a gate structure is formed on the substrate. A doping step is then used to form the drain/source structures by using the gate structure to be a mask. A strap region is formed to couple electrically the conducting layer and the drain/source structures.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

A method is disclosed hereinafter to promote the performance of the DRAM cells by increasing the surfaces of the capacitors. A selective etching step is used to etch the doped region in the trench for increasing the surface of the capacitor. The detailed description is as follows.

Figure 1:
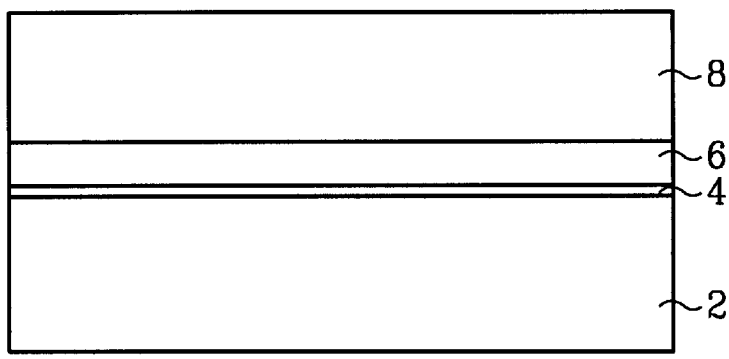
FIG. 1 is a cross sectional view of a semiconductor wafer illustrating the steps of forming a pad oxide layer, a nitride layer, and thick oxide layer in accordance with the present invention.

Referring to FIG. 1, in the preferred embodiment, a silicon substrate 2 is provided with <100> crystallographic orientation. In general, various semiconducting materials, such as gallium arsenide, germanium or silicon on insulator (SOI) can be chosen to serve as the substrate 2. Besides, any other suitable orientation such as <110> or <111> is useful due to the surface property is not critical in the present invention. Next, a pad oxide layer 4 is formed on the substrate 2 by using a thermal oxidation to serve as an etching stopper in latter steps. Then, a nitride layer 6 is formed on the pad oxide layer 4 to serve as a stopper of chemical mechanic polishing (CMP). In a preferred embodiment, the nitride layer 6 can be formed using Low Pressure Chemical Vapor Deposition (LPCVD), Plasma Enhance Chemical Vapor Deposition (PECVD), and so on. Further, the temperature forming the nitride layer 6 is at a range of 400–800° C. In the preferred embodiment, the reaction gases of the step to form nitride layer are $SiH_4$, $NH_3$, $N_2$, $N_2O$ or $SiH_2Cl_2$, $NH_3$, $N_2$, $N_2O$. Then, a thick oxide layer 8 is formed on the nitride layer 6 to serve as a etching mask in latter steps. In a preferred embodiment, the thick oxide layer 8 with a thickness about 3000 to 8000 angstrom can be formed by using chemical vapor deposition (CVD) process, using TEOS as a source at a temperature between about 600 to 800° C. at a pressure 0.1 to 10 torrs.

Figure 2A:
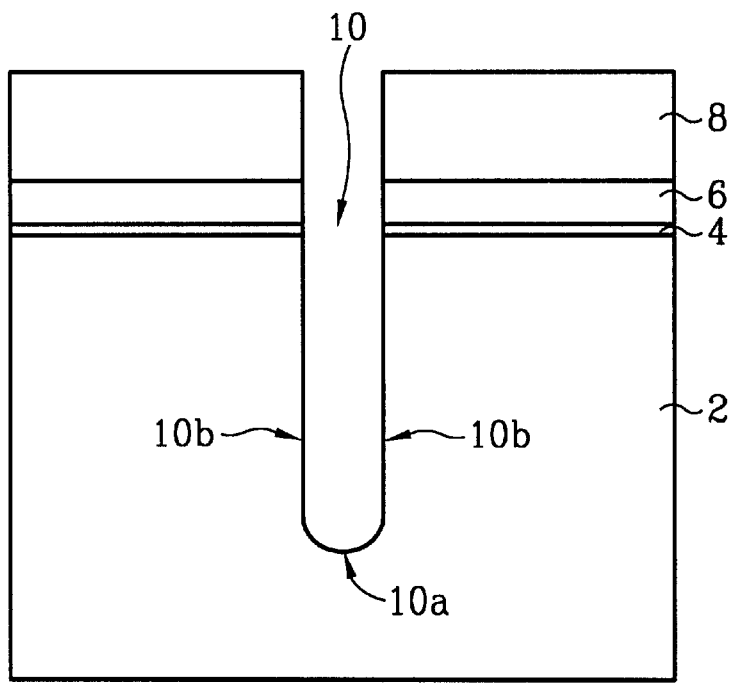
FIG. 2A is a cross sectional view of a semiconductor wafer illustrating the steps of forming a deep trench in accordance with the present invention.
Figure 2B:
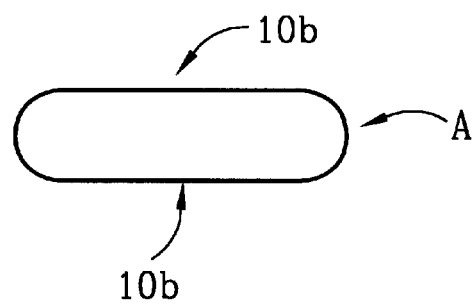
FIG. 2B is a top view of the deep trench structure in accordance with the present invention.

Next, refer to FIG. 2A, an etching step is performed to etch the oxide layer 8, the nitride layer 6 and the pad oxide layer 4 to expose the surface of a portion of substrate 2 for defining the trench pattern. An etching step is performed to etch the substrate 2 exposed in order to form the trench structure 10 in the substrate 2. The trench structure 10 comprises the bottom 10a and the sidewalls 10b adjacent to the bottom 10a. In a preferred embodiment, a reactive ion etching (RIE) step is used to form the trench structure 10, and the etchant used in this step can chosen from the group of SiCl4/Cl2, BCl3/Cl2, HBr/Cl2/O2, HBr/O2, Br2/SF6 and SF6. After the trench structure 10 is formed by using the etching step, the oxide layer 8 is removed. Please refer to FIG. 2B, a top view of the substrate 2 is illustrated, wherein the region A represents the boundaries of the trench structure 10 from the top view.

Figure 3:
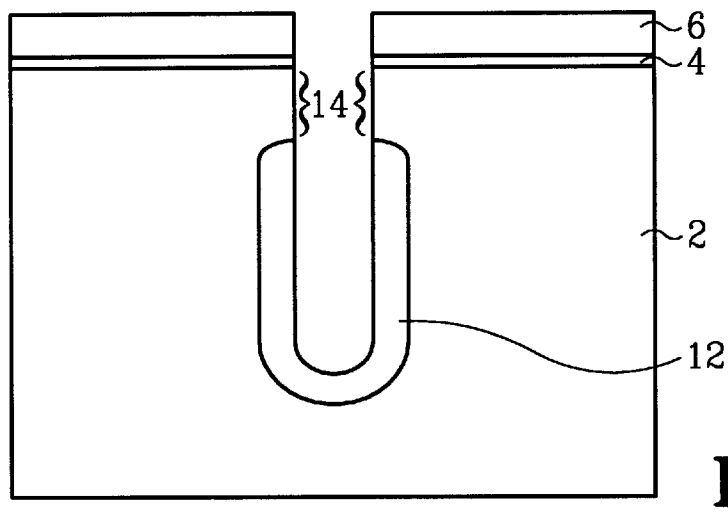
FIG. 3 is a cross sectional view of a semiconductor wafer illustrating the steps of doping the trench structure in accordance with the present invention.
Figure 4A:
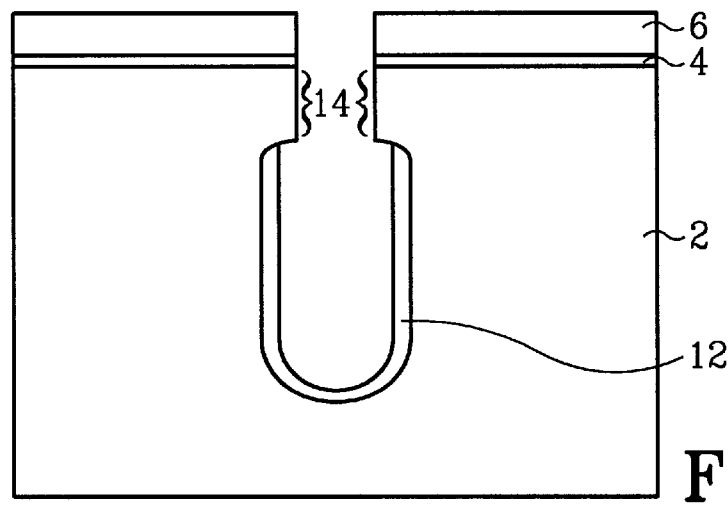
FIG. 4A is a cross sectional view of a semiconductor wafer illustrating the steps of performing a selective etching in accordance with the present invention.
Figure 4B:
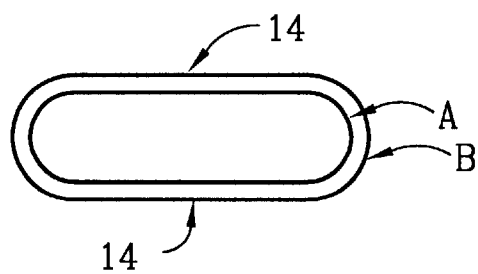
FIG. 4B is a top view of the deep trench structure in accordance with the present invention.

Then, please refer to FIG. 3, a doping step is performed to dope the substrate 2 in order to form a doping region 12 on the bottom 10a and a portion of the sidewalls 10b in trench structure 10. It is noted that the portions of sidewalls 14, called undoped sidewalls, adjacent to the top surface of the substrate are not doped in this step. Next, as shown in FIG. 4A, a selective etching step is used to remove a portion of the doping region 12, wherein the etching selectivity of the doping region 12 is higher than that of the undoped sidewalls 14. After the selective etching step is done, the residual doping region 12 is used to serve as a first storage electrode of the capacitor formed in latter steps. It is noted that the undoped sidewalls 14 do not suffer damage in the selective etching step due to lower selectivity. In a preferred embodiment, a wet selective etching step is used in this step, and the etchant comprises of $HNO_3$, $CH_3COOH$, HF and deionized (DI) water. Alternatively, a dry etching step can be used, and the etchant comprises of HBr and $Cl_2$. Accordingly, the etching selectivity between the doping region 12 and the undoped sidewalls 14 is increased outstandingly. It is noted that the surface of the doping region 12 is enlarged transparently after the selective etching step is done. As the top view of the trench structure 10 shown in FIG. 4B, wherein the solid line A represents the boundary of the trench structure 10 (namely the undoped sidewalls 14), and the dotted line B represents the boundary of the residual doping region 12 after performing the selective etching step. Evidently, the surface of the doping region 12 is increased by using the selective etching.

Figure 5:
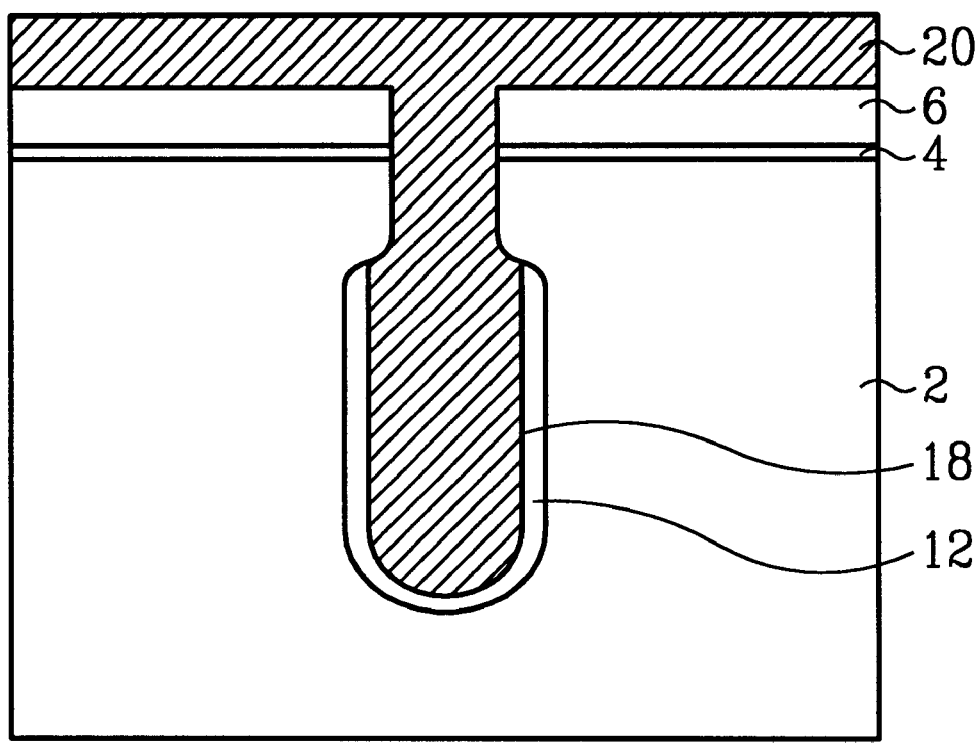
FIG. 5 is a cross sectional view of a semiconductor wafer illustrating the steps of forming a conducting layer into the deep trench in accordance with the present invention.

Then, refer to FIG. 5, Then, a capacitor dielectric film 18 is formed along the surface of the trench structure 10. The capacitor dielectric film 18 is preferably formed of either a double film of nitride/oxide film, a triple film of oxide/nitride/oxide, or any other high dielectric film such as tantalum oxide ($Ta_2O_5$), BST, PZT, PLZT, etc. A first conducting layer 20 is then formed on the substrate 2 and filled into the trench structures 10. In general, the first conducting layer 20 is formed of doped polysilicon, in-situ doped polysilicon, aluminum, copper, tungsten, titanium or alloy.

Figure 6:
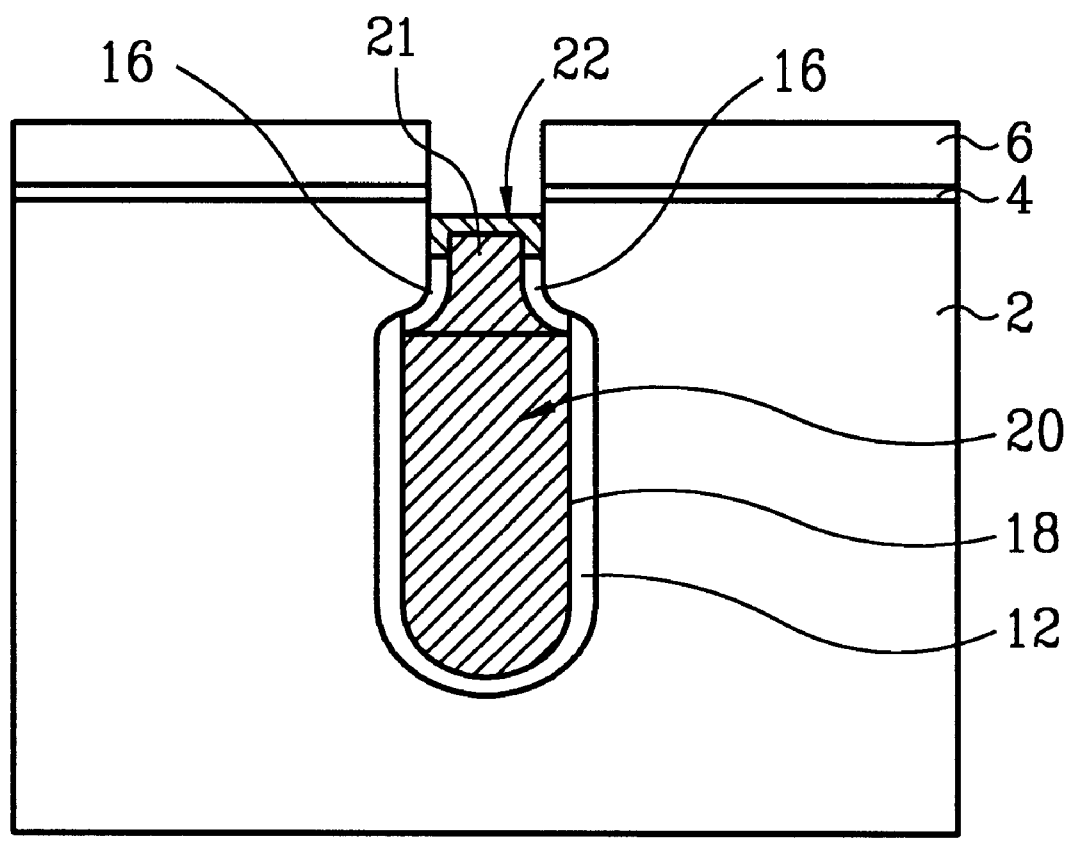
FIG. 6 is a cross sectional view of a semiconductor wafer illustrating the steps of forming a polysilicon layer into the deep trench in accordance with the present invention.

Next, refer to FIG. 6, an etching back step is performed to remove the first conducting layer 20 above the substrate 2 and a portion of the first conducting layer 20 in the trench structure 10. Namely, after the etching back procedure is done, the top surface of the first conducting layer 20 is below the top surface of the substrate 2, and a portion of the sidewall of the substrate 2 is exposed. The residual first conducting layer 20 in the trench structures 10 is used to serve as the second storage electrodes of the capacitors.

Still refer to FIG. 6, a collar oxide layer 16, a second conducting layer 21 and polysilicon layer 22 are formed on substrate 2 in sequence. A reactive ion etching (RIE) step is then used to etch the second conducting layer 21 in the trench structures 10. After the RIE step is performed, the surface of the second conducting layer 21 is below the surface of the substrate 2. Then, a wet etching step is performed to remove portions of the collar oxide layers 16. The top surface of the collar oxide layers 16 is below the surface of the second conducting layer 21. Subsequently, a polysilicon layer 22 is formed above the second conducting layer 21 and the collar oxide layers 16, and filled into the trench structures 10. The top surface of the polysilicon layer 22 is below that of the substrate 2 after performing an etching back step to remove a portion of the polysilicon layer 22. Usually, a thermal anneal step in latter steps is used to diffuse the dopants in the second conducting layer 21 into the polysilicon layer 22 and cause the polysilicon layer 22 with conductivity. Besides, the polysilicon layer 22 can also formed of doped polysilicon or in-situ doped polysilicon.

Figure 7:
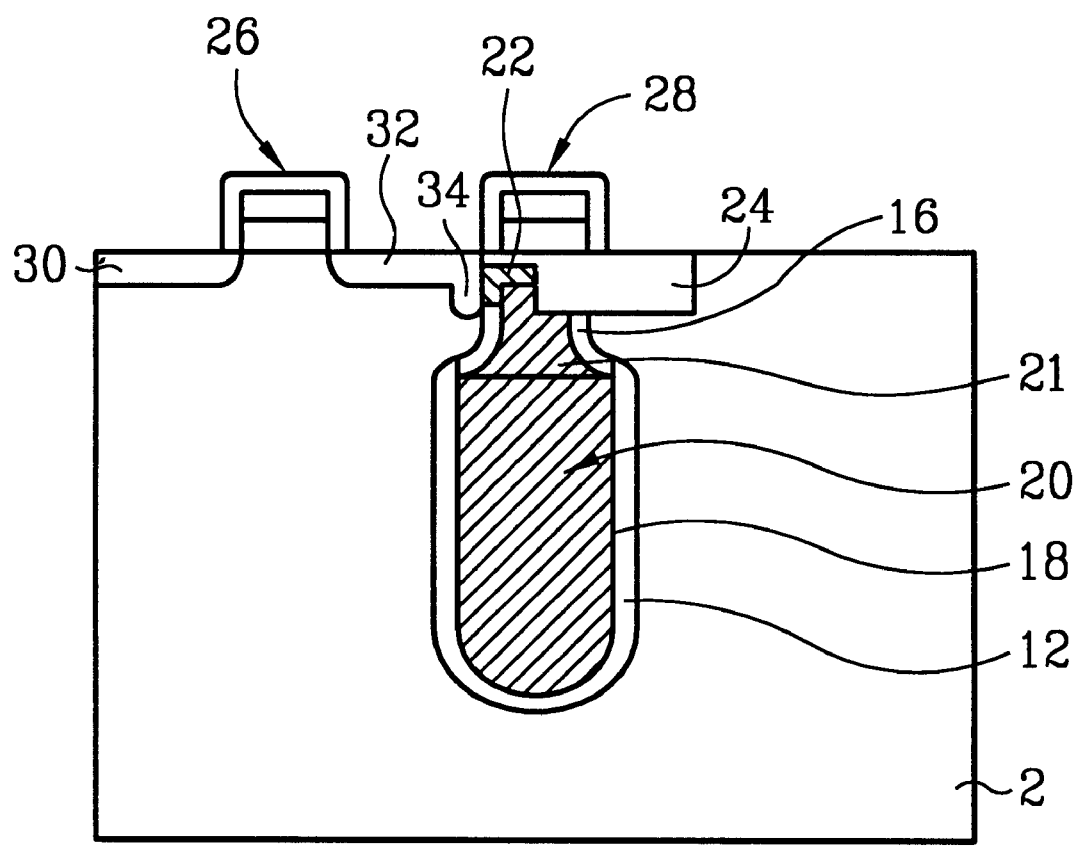
FIG. 7 is a cross sectional view of a semiconductor wafer illustrating the steps of forming the DRAM cell with the deep trench structure in accordance with the present invention.

Then, refer to FIG. 7, a shallow trench insulator (STI) structure 24 is formed on the substrate 2 by using the well known techniques to define the active area on the substrate 2. It is noted that the STI structure 24 covered above the second conducting layer 21 and the polysilicon layer 22 in order to insulate the storage electrode and the wordlines formed in latter steps. Then, the gate 26 and the wordline 28 are formed in sequence by using the well known art. Next, a doping step is performed to form the drain 30 and source 32 by using the gate 26 as a mask. A strap region 34 is formed in substrate 2 to connect electrically the polysilicon layer 22 and the source 32. In a preferred embodiment, a thermal anneal step is performed to diffuse the dopants in the polysilicon layer 22 into the strap region 34 as shown in FIG. 7.

It is noted that the surface of the capacitor increases and the storage capacity also increases by using the selective etching step to remove a portion of doping region in the trench according to the present invention. In general, the capacitance increases about 20% following the surface of the capacitor increases about 30%. Besides, the undoped sidewalls can prevent from damage due to the lower etching selectivity. Thus, the integration of devices can be promoted due to the scale of trench opening is still retained after the surface of doping region is enlarged by performing the selective etching step.

As is understood by a person skilled in the art, the foregoing preferred embodiment of the present invention is illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming a trench capacitor for a DRAM cell over a semiconductor substrate, said method comprises the following steps of:
   etching said substrate to form a trench structure in said substrate, wherein said trench structure has a bottom and sidewalls, and said sidewalls have an upper portion and a lower portion;
   doping said trench structure to form a doping region on said bottom and said lower portion of said sidewalls;
   selective etching said trench structure to remove a portion of said doping region, wherein an etching selectivity of said doping region is higher than that of undoped sidewalls;
   forming a conformal dielectric layer in said trench structure; and
   forming a conducting layer to fill said trench structure, wherein said conducting layer is coupled electrically with a drain structure.

2. The method of claim 1, further comprises the following steps before etching said substrate to form said trench structure:
   forming a pad oxide layer on said substrate;
   forming a nitride layer on said pad oxide layer; and
   forming a mask layer on said nitride layer.

3. The method of claim 2, wherein said mask layer being made of oxide.

4. The method of claim 1, wherein said substrate being made of silicon.

5. The method of claim 1, wherein said selective etching step being a wet etching step, and the etchant used in said wet etching step comprising of $HNO_3$, $CH_3COOH$, HF, and Deionized Water (DI) water.

6. The method of claim 1, wherein said selective etching step being a dry etching step, and the etchant used in said dry etching step comprising of HBr and $Cl_2$.

7. The method of claim 1, wherein said dielectric layer is a material selected from the group consisting of O/N, O/N/O, $Ta_2O_5$, BST PZT.

8. The method of claim 1, wherein said conducting layer is a material selected from the group consisting of doped polysilicon, in-situ doped polysilicon, aluminum, copper, tungsten, titanium, and a combination of above listed metals.

9. A method of forming a DRAM cell with a trench capacitor over a semiconductor substrate, the method comprises the following steps of:
   forming a mask layer on said substrate;
   etching said mask layer to expose a portion of a surface of said substrate;
   etching said substrate to form a trench structure in said substrate by using said mask layer to be an etching mask, wherein said trench structure has a bottom and sidewalls, and said sidewalls have an upper portion and a lower portion;
   doping said trench structure to form a doping region on said bottom and said lower portion of said sidewalls, and said doping region being adjacent to an undoped region of said sidewalls;
   selective etching said trench structure to remove a portion of said doping region, wherein an etching selectivity of said doping region is higher than that of said undoped sidewalls, and a residual doping region serves as a first storage electrode;
   forming a conformal dielectric layer in said trench structure;
   forming a collar oxide layer on a lateral surface of said undoped sidewalls;
   forming a conducting layer to fill said trench structure for serving as a second storage electrode;
   forming a gate structure above said trench structure;
   forming drain/source (D/S) structures by performing a doping step by using said gate structure to be a mask; and
   forming a strap region to couple electrically said D/S structures and said conducting layer.

10. The method of claim 9, wherein said substrate being made of silicon.

11. The method of claim 9, wherein said selective etching step being a wet etching step, and the etchant used in said wet etching step comprising of $HNO_3$, $CH_3COOH$, HF, and Deionized Water (DI) water.

12. The method of claim 9, wherein said selective etching step being a dry etching step, and the etchant used in said dry etching step comprising of HBr and $Cl_2$.

13. A method of forming a trench capacitor for a DRAM cell on a semiconductor substrate, the method comprises the following steps of:
   forming a trench in the substrate, wherein the trench has a bottom wall portion, an upper sidewall portion and a lower sidewall portion adjacent to the bottom wall portion;
   forming a doped region extending from a surface of the bottom wall portion and the lower sidewall portion to a first depth;
   selective etching the doped region from the surface to a second depth which is less than the first depth, a residual doped region serves as a first storage electrode;
   forming a conformal dielectric layer in the trench;
   forming a first conducting layer to fill the trench, a top surface of the first conducting layer is lower than a top surface of the semiconductor substrate;
   forming a collar oxide layer on a lateral surface of the upper sidewall portion;
   forming a second conducting layer to fill the trench, the first conducting layer and the second conducting layer serve as a second storage electrode; and
   forming a conductive strap in the semiconductor substrate to electrically, couple the second storage electrode and a drain structure.

14. The method of claim 13, wherein the selective etching step is a wet etching step, and the etchent used in the wet etching step comprises $HNO_3$, $CH_3COOH$, HF, and deionized water.

15. The method of claim 13, wherein the selective etching step is a dry etching step, and the etchent used in the dry etching step comprises HBr and $Cl_2$.

16. The method of claim 13, wherein the dielectric layer is a material selected from the group consisting of O/N, O/N/O, $Ta_2O_5$, BST, PZT.

17. The method of claim 13, wherein the first conducting layer is a material selected from the group consisting of aluminum, copper, tungsten, titanium, and a combination of the above listed metals.

18. The method of claim 13, wherein the second conducting layer is a material selected from the group consisting of aluminum, copper, tungsten, titanium, and a combination of the above listed metals.

* * * * *